United States Patent
Ivansen et al.

(10) Patent No.: US 7,930,653 B2
(45) Date of Patent: Apr. 19, 2011

(54) TRIANGULATING DESIGN DATA AND ENCODING DESIGN INTENT FOR MICROLITHOGRAPHIC PRINTING

(75) Inventors: Lars Ivansen, Solna (SE); Anders Österberg, Täby (SE)

(73) Assignee: Micronic Laser Systems AB, Taby (SE)

( * ) Notice: Subject to any disclaimer, the term of this patent is extended or adjusted under 35 U.S.C. 154(b) by 980 days.

(21) Appl. No.: 11/736,490

(22) Filed: Apr. 17, 2007

(65) Prior Publication Data

US 2008/0260283 A1 Oct. 23, 2008

(51) Int. Cl.
*G06F 17/50* (2006.01)
(52) U.S. Cl. ............... 716/50; 716/51; 716/54; 716/55
(58) Field of Classification Search .......... 716/50–55
See application file for complete search history.

(56) References Cited

U.S. PATENT DOCUMENTS

| 5,379,225 | A * | 1/1995 | Tazawa et al. ............... 700/98 |
| 6,271,852 | B1 | 8/2001 | Kamiyama et al. |
| 6,889,176 | B1 * | 5/2005 | Buttolo et al. ............... 703/1 |
| 7,055,127 | B2 | 5/2006 | Pierrat et al. |
| 2003/0124463 | A1 | 7/2003 | Sekigawa et al. |
| 2004/0205686 | A1 | 10/2004 | Luttrell |
| 2005/0091631 | A1 * | 4/2005 | Gallatin et al. ............... 716/20 |
| 2005/0216877 | A1 | 9/2005 | Pack et al. |
| 2006/0033745 | A1 | 2/2006 | Koselj et al. |

OTHER PUBLICATIONS

O'Rourke, Joseph. Computational Geometry in C, Second Ed. Cambridge University Press, 1998, pp. 1-62.
Alain Fournier & Delfin Y. Montuno, "Triangulating Simple Polygons and Equivalent Problems" ACM Transactions on Graphics, vol. 3 No. 2 (Apr. 1984) 153-174.
Hiroomi Nakao & Koichi Moriizumi, "A Figure-Fracturing Algorithm for Generating High-Quality Electron-Beam Exposure Data" Mitsubish Electric Advance, vol. 75 (Jun. 1996) 38-39.
International Search Report for Intl. Application No. PCT/EP2008/054649 mailed Sep. 19, 2008.
Toussaint, Godfried. "Efficient triangulation of simple poligons", The Visual Computer, 1991, pp. 280-295.

* cited by examiner

*Primary Examiner* — Paul Dinh
(74) *Attorney, Agent, or Firm* — Haynes Beffel & Wolfeld LLP; Ernest J. Beffel, Jr.

(57) ABSTRACT

The present disclosure relates to fracturing of polygon data, with one application being microlithography. In particular, it relates to preserving data regarding edges and/or vertices of the original polygons as the polygons are triangulated and even if the results of triangulation are further fractured.

35 Claims, 5 Drawing Sheets

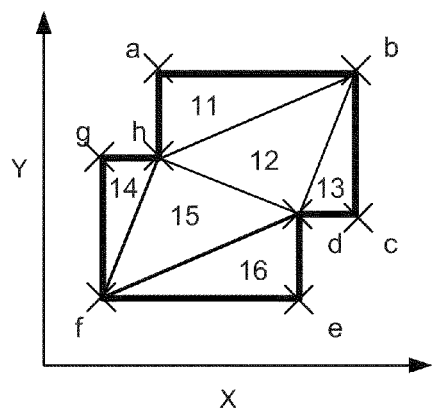
FIG. 3
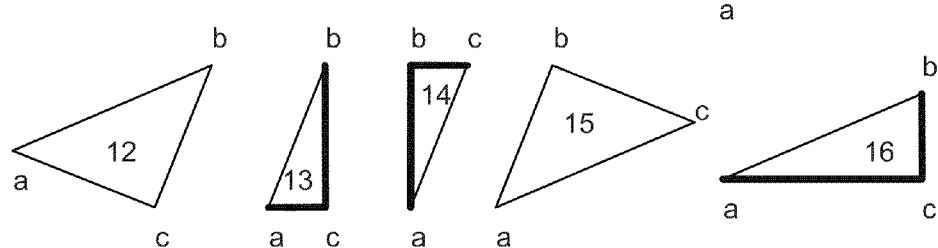
FIG. 4
FIG. 5

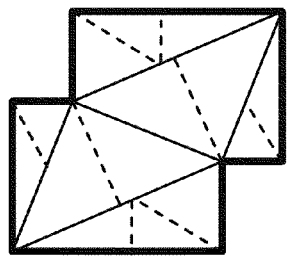
FIG. 6
| 00 | 01 | 10 | 11 |
|---|---|---|---|
| △ | | | |
| △ | △ | △ | △ |
| △ | △ | △ | △ |
| △ | | | |
FIG. 7
Only redundant corners possible and hence no encoding is required
One side is outline; 0, 1 and 2 corners possible
Two sides are outlines; 1, 2 and 3 corners possible
All three sides are outlines; all corners must be true corners
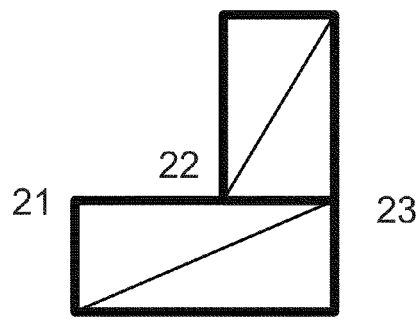
FIG. 8

TRIANGULATING DESIGN DATA AND ENCODING DESIGN INTENT FOR MICROLITHOGRAPHIC PRINTING

RELATED APPLICATION

This application is related to U.S. application Ser. No. 09/954,721, "Graphics Engine for High Precision Lithography", filed on Sep. 12, 2001, which is hereby incorporated by reference. It also is related to U.S. patent application Ser. No. 10/410,874, filed on 10 Apr. 2003, entitled "Methods and Systems for Process Control of Corner Feature Embellishment" by inventors Torbjörn Sandström, Hans Martinsson, Niklas Eriksson and Jonas Hellgren, which also is incorporated by reference.

BACKGROUND OF THE INVENTION

The present disclosure relates to fracturing of polygon data, one application being microlithography. In particular, it relates to preserving data regarding edges and/or vertices of the original polygons as the polygons are triangulated and even if the results of triangulation are further fractured.

Microlithography is the process of writing a circuit design (sometimes called the geometry) onto a workpiece having a radiation sensitive layer. The workpiece is typically either a wafer upon which the design is written directly, or a photomask for use in exposing equipment, such as a stepper or scanner. The lithographic writing equipment writes the geometry onto the workpiece, using a laser or charged beam to expose a resist layer. This exposure changes the molecular composition of the resist. During the developing process for a positive resist, any resist that has been exposed will be removed. In some applications, a negative resist is used where the resist that was not exposed will be removed in development.

Photomasks are high precision plates containing microscopic images of electronic circuits. Photomasks typically are made from very flat pieces of quartz or glass with a layer of chrome on one side. Etched in the chrome is a portion of an electronic circuit design. This circuit design on the mask is also sometimes called the geometry.

Photomasks are used in wafer fabrication, mostly to make ICs (integrated circuits). ICs are used in many products like computers, calculators, cars, cameras, and stereos. Photomasks are also used to make flat panel displays, thin film heads, PC boards, etc.

During development, a customer designs a circuit using tools that digitally store the information. The customer then sends the digitized data containing the design for each layer to the mask maker or direct writing vendor. The data can be sent on a disk, magnetic tape, via Internet or dedicated lines.

The mask maker takes the customer's data and formats it for the actual tools or systems in which the masks will be made. This includes fracturing the data, sizing the data if needed, rotating the data if needed, adding fiducials and internal reference marks, and making a jobdeck, which includes instructions for the placement of all the different patterns on the mask.

Fracturing the data means translating the customer data into a language the write tool can understand. The writing system typically uses rectangles and trapezoids—so the customer data is divided up (fractured) into these shapes. The jobdeck with the fractured data is put on a data media and sent to the write area or pulled directly to the machines using network software.

During printing, additional pattern processing takes place. The geometries are spatially reorganized to match the writing sequence of the tool. For some systems, this means rendering the geometries into pixels to be imaged by the exposure system. For other systems, this means translating the geometries into a format appropriate for vector shaped beams (VSBs) or laser scanning.

In more detail, the typical fracturing process in lithography divides arbitrary polygons into rectangles and/or trapezoids as illustrated in FIG. 1 with horizontal trapezoidalization. Starting from each vertex, cut lines are generated in horizontal extent. Some algorithms have optimizations and rules criteria to suppress the generation of very narrow geometries (which may be harmful to the critical dimension, CD, on some writing systems), and also combine horizontal and vertical cut lines, but the basic principle remains the same. See, e.g., Nakao and Morizumi, "A Figure-Fracturing Algorithm for Generating High-Quality Electron-Beam Exposure Data", Mitsubishi Electric Advance, Semiconductors Edition, Vol. 75 at 38-39 (June 1996).

In traditional fracturing of outlined polygons, the information as to which edges represent the true outline of the geometry and which edges are a result of the fracturing operation, is lost. As true outlines have an impact on CD on the mask and false (inner) outlines do not, true outlines must be rendered with highest precision possible, but that is not required with the false ones. If this distinction is not available, they must all be treated as potentially vital for CD and hence processed with high-precision, compute-intensive methods. This information would be valuable for, among other things, accelerating succeeding rendering and improving image processing on the image.

Classification of the edges of fractured geometry is not binary. Some edges could be both internal to the original polygon or belong to its true outline as in example 1B, edge (1-2) which is largely internal, but includes a true outline segment near (1). While one could imagine further subdivision of the geometries until all edges becomes unambiguous, such an algorithm could be become too immensely complex to support any polygon shapes and contain an arbitrary number of vertices.

Furthermore, the present algorithms have the side effect of generating new vertices. If new vertices are inserted on angled lines, one risks introducing grid snapping effects when they do not coincide with the design grid. Grid snapping can harm the fidelity of the mask and result in defects and circuitry malfunctions or in image interference effects, when the limits of numerical precision cause a vertex to move onto an actual or virtual grid. Image interference effects are particularly harmful to display applications.

An opportunity arises to improve fracturing approaches used in microlithography and increase processing speed. A further opportunity arises to retain useful boundary and/or original vertex information during fracturing. Better processing with reduced resources and equal or better critical dimension consequences may result.

SUMMARY OF THE INVENTION

The present disclosure relates to fracturing of polygon data, one application being microlithography. In particular, it relates to preserving data regarding edges and/or vertices of the original polygons as the polygons are triangulated and even if the results of triangulation are further fractured.

Particular aspects of the present invention are described in the claims, specification and drawings.

BRIEF DESCRIPTION OF THE DRAWINGS

All sides of a triangle can be classified as representing either an outline of a polygon or an internal cut-line. FIG. 3 depicts the possible combinations.

FIG. 4 illustrates, since using triangulation in fracturing does not generate new vertices, all corners of the resulting triangles which represents the true corners of the original polygon. In FIG. 4, vertices a-h represent true corners of the original polygon.

FIG. 5 is an example of applying the classification depicted in FIG. 3 to the triangulated polygon in FIG. 4.

Second level fracturing of the polygon from FIG. 4 is illustrated by dashed lines in FIG. 6.

FIG. 7 is a table depicting the corner classification that can be encoded with two bits.

FIG. 8 depicts adjoining polygons that create additional complexity.

Figure 9:
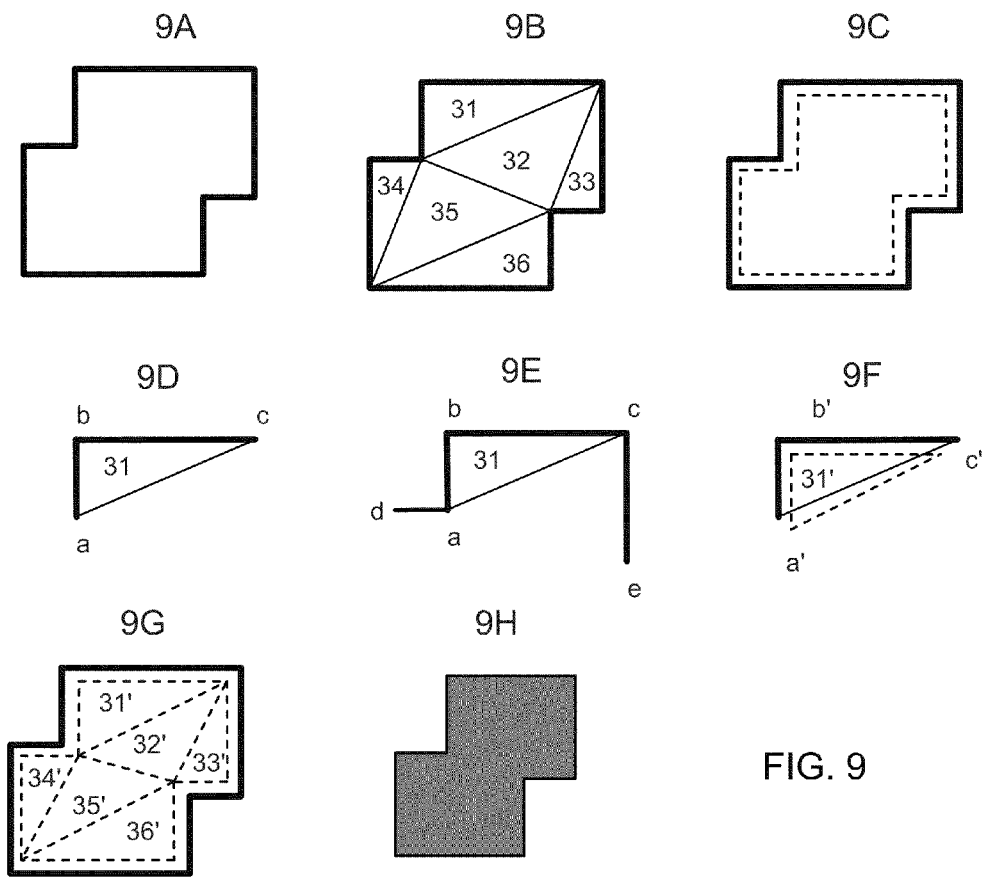

FIG. 9 illustrates sizing performed on triangles constituting a polygonal shape.

Figure 10:
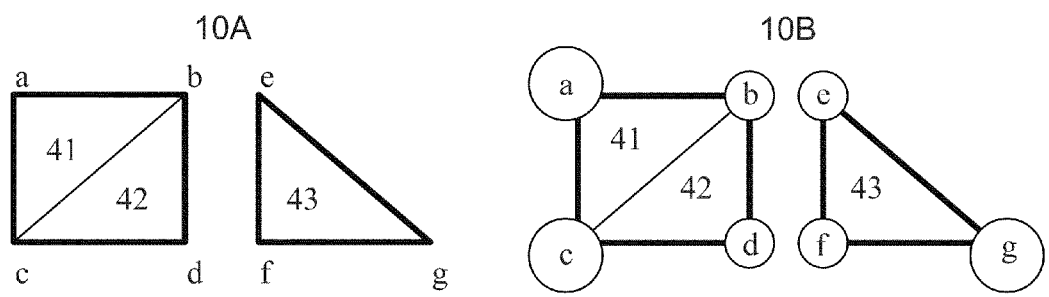

The principles of corner enhancement and proximity down-weighting are illustrated in FIG. 10.

Figure 11:
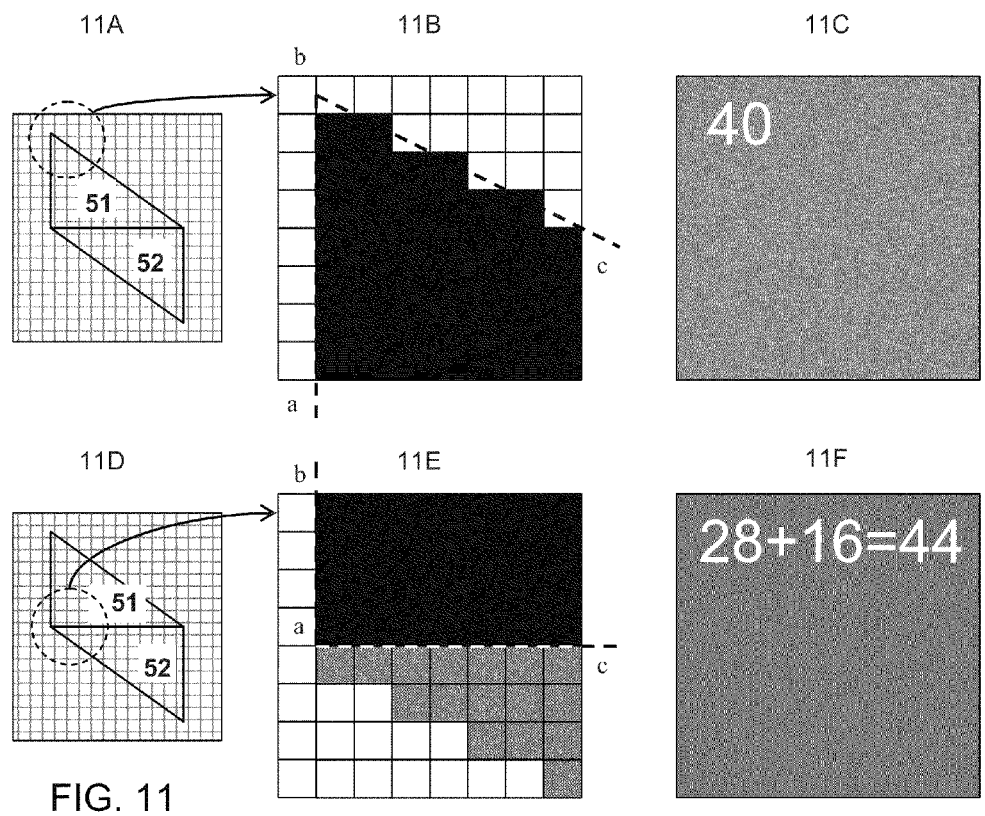

FIG. 11 provides examples of leveraging knowledge of true edges vs. false edges.

Figure 12:
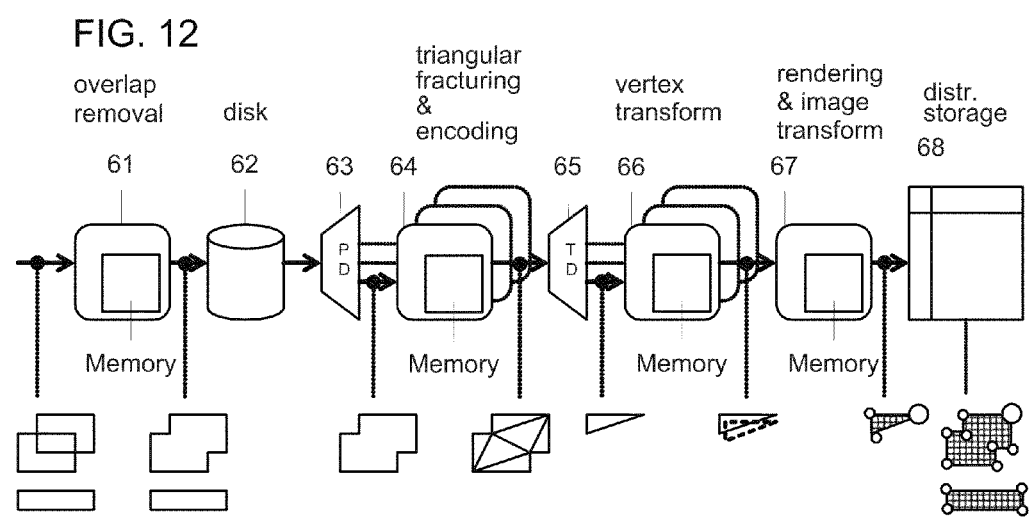

FIG. 12 is a block diagram of an apparatus for computational lithography.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Microlithography has avoided using triangulation for partitioning of polygons, due to the constraints of mask writing tools. Arbitrarily aligned triangles are not useful in tools such as the one described in Nakao and Morizumi.

New generations of machines, such as the Sigma7500 produced by the assignee of this disclosure, provide more flexible writing mechanisms and datapaths. These new machines can be made compatible with computer graphics processing techniques, in which so-called triangulation is used for partitioning of polygons into primitive objects, into triangles with arbitrary edge alignments.

Combined triangles can represent any polygonal shape. Many proven and efficient algorithms are available to generate triangles to represent polygons. Typically, generic polygons are first converted into monotone polygons (the vertices in each chain of a monotone polygon are sorted with respect to the line of monotonicity), and then into triangles. Any monotone polygon whose direction of monotonicity is given may be triangulated in linear time. A. Fournier and D. Y. Montuno. Triangulating simple polygons and equivalent problems. ACM Trans. on Graphics, 3:153-174, 1984.

Figure 1:
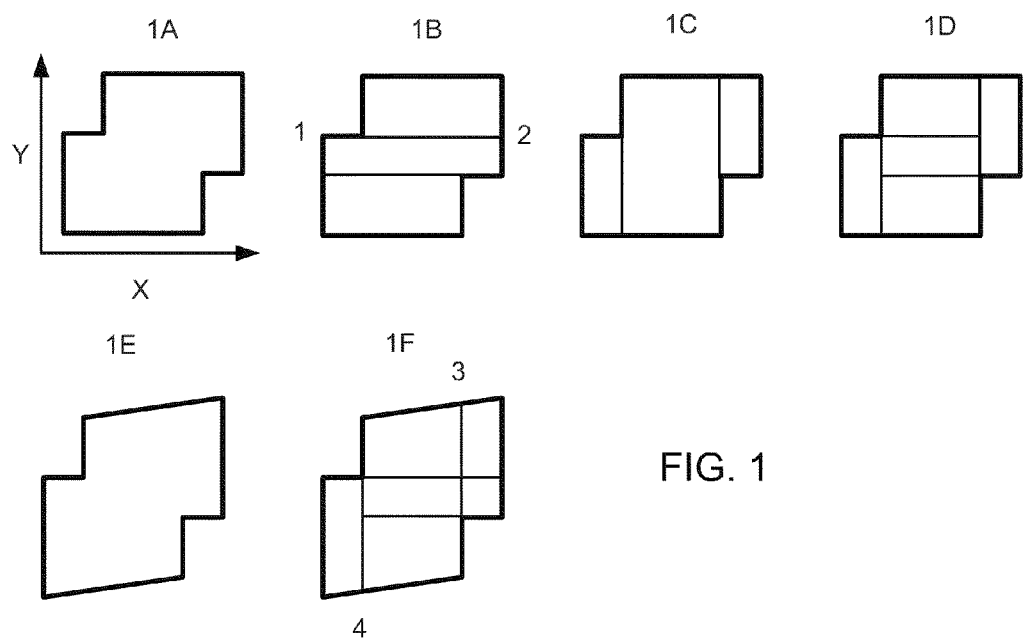
FIG. 1 illustrates the typical fracturing process in lithography dividing arbitrary polygons into rectangles and/or trapezoids with horizontal trapezoidalization.
Figure 2:
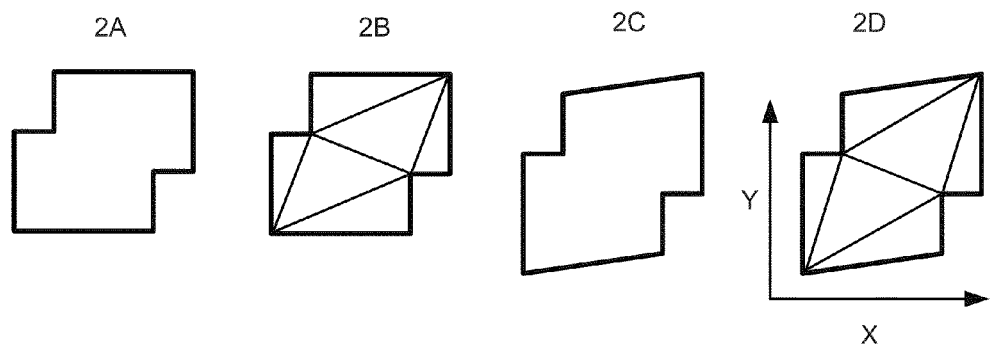
FIG. 2 depicts a diagonal of a polygon with a line segment between two of its vertices that are visible to one another.

Triangulation does not introduce new vertices (hence avoids grid-snapping) if they rely on partitioning the polygons with non-crossing diagonals. A diagonal of a polygon is a line segment between two of its vertices that are visible to one another, as depicted in FIG. 2, examples 2B and 2D. Hence, all vertices of the first triangulation are true vertices of the original polygon.

Also, the resulting triangles all have unambiguous edge properties; they are either representing the outline of the original polygon or a cut line of the interior. The classification of edges is given by the triangulation itself; all cut lines generated by the algorithm represent interior edges. The remaining edges are outer boundaries by definition.

Properties of edges and vertices of triangles produced by triangulation can usefully be encoded and not lost. In order to leverage properties of the original design in succeeding processing steps, the properties can be encoded in the geometry data, with the resulting triangles. As previously described, all sides of a triangle can be classified as representing either an outline of a polygon or an internal cut-line. FIG. 3 depicts the possible combinations. Bold lines symbolize sides that were outside borders of the original polygon and thin lines symbolize interiors of the original polygon. A total of eight variants can be observed, from stand alone figures (all outlines) to figures that are completely encapsulated (no outlines) by the larger shape of which they are a part.

In its basic form, a triangle is defined by three coordinate pairs; a, b and c. Since the coordinates define the same triangle regardless of the order in which they are listed, information can be encoded by choosing the sequence or permutation in which the vertices appear in the data set. In FIG. 3, all of the columns designate the bottom left vertex as "a" and remaining vertices are designated in a clockwise order. A triangle appears in the first column if 1) the triangle has zero or three sides that are outlines, or 2) if the triangle has one or two sides that are outlines and vertex a is the first vertex of the outline side(s), when tracing consecutive outlines sides in a clockwise direction. The second and third column classify triangles with one or two sides that are outlines. The second column triangles have vertex b as the first of the outline sides. The third column triangles have vertex c as the first. By listing vertexes in an order given at the top of the columns and combining this ordering with two additional bits that count the number of sides that are outlines, as in FIG. 3, all cases are covered with only two additional bits added to the data stream.

As FIG. 4 illustrates, since using triangulation in fracturing does not generate new vertices, all corners of the resulting triangles represent true corners of the original polygon. In FIG. 4, vertices a-h represent true corners of the original polygon. Corner information can be leveraged in succeeding data processing steps including, but not limited to, corner enhancement. Real time corner enhancement is described in the application incorporated by reference that is entitled "Methods and Systems for Process Control of Corner Feature Embellishment."

FIG. 5 is an example of applying the classification depicted in FIG. 3 to the triangulated polygon in FIG. 4. The resulting classification of edges is:

| Classifications of Edge Properties | | | |
|---|---|---|---|
| Object | Sequence | Class | Comment |
| 11 | a, b, c | 10 | Two sides outline |
| 12 | a, b, c | 00 | Encapsulated |
| 13 | b, c, a | 10 | Two sides outline |
| 14 | a, b, c | 10 | Two sides outline |
| 15 | a, b, c | 00 | Encapsulated |
| 16 | b, c, a | 10 | Two sides outline |

In some instances, second level fracturing may be needed. Fracturing by triangulation generates triangles, which are a very basic geometry that can easily be accelerated in rendering and image processing. But triangulation algorithms do not limit the dimensions of resulting triangles and may produce very large objects as a result. Acceleration hardware typically has fixed amount of memory available. Some absolute limits on the dimensions of the geometries to be accelerated are useful. Second level fracturing reduces the dimensions of the triangulated geometries.

Fracturing triangles is quite different from fracturing polygons, because new vertices must be inserted. The properties of triangles produced by second level fracturing are different than the first level fracturing.

Second level fracturing of the polygon from FIG. 4 is illustrated by dashed lines in FIG. 6. The same classification and encoding of edges can be applied to the resulting triangles of the second level fracturing as to the first level, but corner properties need to be handled differently because some new vertices are introduced. Previously, all corners were part of the original polygon, but here we introduce new corners. The information about true corners should be allowed to propagate during the introduction of new corners. The distinction between true and introduced corners is encoded. Two assertions simplify the encoding.

Assertion 1: A triangle with no true outlines has no true corners that are non-redundant. Looking at FIG. 5, we can see that triangles 12 and 15 indeed have vertices that coincide true corners of polygons, but these true corners are already encoded by triangles (11 and 14) and (13 and 16), respectively. The vertices of triangles 12 and 14 that coincide with true corners of polygons are redundant.

Assertion 2: A triangle with three true outlines has three true corners. Such a triangle can stand alone and is a true outline by definition.

The corner classification can then be encoded with two bits according to the table in FIG. 7. The row in which a triangle appears depends on the number of edges that are true edges or outline edges. This is the same row classification that we disclosed in FIG. 3. No true corner encoding is required for zero or three true edges, applying assertions 1 and 2. For one or two true edges, true corners must touch true edges. Two data bits are enough to encode the positions of true corners, given the number of true edges in the triangle.

The method of encoding properties into triangles as described in this document is just one way of propagating the classification of properties in a lithography system. Persons skilled in the art know that such information can be encoded in several ways including, but not limited to, grouping of objects with similar properties or feeding objects with certain properties in different processing channels.

The method disclosed so far has been applied to a single polygon. FIG. 8 depicts adjoining polygons that create additional complexity, because they introduce edges and/or corners that are true edges and corners of a particular polygon but are interior to the geometry or feature defined by the combined polygons. For instance, edge 21-23 will be classified as an outline or true edge, while only part of the edge is an outline of the combined polygons. Edge 22-23 is the portion that will initially be classified as outline, even though it is interior. Similarly, vertex 23 will be classified as a true corner, even though it is merely a point along a straight edge.

Fortunately, this complexity can only impact the classification of edges as outlines and classification of corners as true while they are in fact not. It will never classify edges as interior, or unimportant for CD compliance, when in fact they are true edges. It will never fail to detect true corners.

With an overlap removal function, as illustrated in FIG. 12, ref. 61 and described below, errors resulting from mis-classification of corners as true can be reduced or eliminated.

Leveraging Triangle Properties for Morphology and Vertex Transformations

Triangular objects and their corresponding properties lend themselves very well to vertex transformations, rendering and image processing typically associated with microlithography applications, where very high processing capacity and precision are fundamental. Examples of processing enhanced by this technology include: sizing, morphology (such as distortion compensation), corner enhancement, parallelization, and memory preservation.

Sizing is a morphing operation where the outline of objects in an image representation are displaced with the sizing amount along their gradient field, while at the same time preserving their location and center of gravity. This is not to be confused with the operation of scaling where all coordinates in an image are multiplied with a scaling factor. Sizing is frequently used in lithography to counterbalance variables in the manufacturing such as the dose in the projection system and the impact of development and etching processes on latent images. One reason sizing is considered a non-trivial operation is that the final outlines of the image must be known before the sizing operation can be applied. In computational lithography, complex polygonal shapes are fractured into simple renderable objects (like rectangles and trapezoids or, as suggested in this disclosure, triangles); thus multiple simple objects combined form the complex final shapes of the lithographical image. Typically, the final shapes are unknown until all simple objects have been combined, preventing autonomous and overlapping operations, and hence defeating effective parallelism. By leveraging the triangle properties, true edges can be recognized and transformed while employing parallelism.

As described in the encoding sections in this document, the triangles propagate information regarding true and false corners and true and false edges of the original polygonal shape. For a given area of the pattern to be processed, the triangles are now gathered and a sorted list established. The list includes records of true vertices and the two edges originating in said vertices, as illustrated below. Some vertices will coincide at the exact same location, but there will only be two true edges related to every true vertices. One can imagine exceptions to this constraint in, for instance, a starburst pattern where a plurality of polygons originate in the same coordinate, but in a lithographical sense such patterns violate semiconductor design rules and are not allowed. However, there is nothing in this invention that prevents processing of such patterns and the said list of true vertices can easily support multiple records with identical coordinates.

vertex(x,y), edge1(x,y), edge2(x,y)
vertex(x,y), edge1(x,y), edge2(x,y)
. . .

When an arbitrary triangle is to be rendered in the current pattern area, the true corners with at least one false edge are compared to the list of vertices. Since the list of vertices is sorted on coordinates, this look-up is a low cost operation. From the table, the true edges related to the vertices are extracted. With the knowledge of the true polygonal outline at each vertex, a sizing transformation can be performed on the triangle without combining the subject triangle with additional triangles constituting other parts of the same polygonal shape.

FIG. 9 illustrates sizing performed on triangles constituting a polygonal shape. By leveraging knowledge of true edges and vertices of the original polygon, the sizing operation can be applied to individual triangles without the need to consider the final shape of the combined triangles. In FIG. 9, polygon 9A is fractured for a lithography writing system through triangulation as illustrated in 9B. True and false vertex and true and false edge properties are encoded for the triangles 31-36. In this example, as a write-time parameter, the user requests negative sizing or a shrink of the pattern, which may compensate for the current settings of the writing system or processing of the latent image. The expected result of said sizing is shown as a dashed line in 9C.

The data path of the writing system receives the six triangles and generates a sorted or indexed list of the vertices and their true edges. The triangles are then processed individually and can be processed in parallel. Triangle 31, shown in 9D, has three true corners (a, b, c), two true edges (a-b and b-c) and one false edge (a-c). As only one of the true edges is known to vertices a and c, the lacking true edges (a-d and c-e in illustration 9E) are extracted from the list of vertices. With the extracted edges that are relevant to sizing of triangle 31, the relevant part of the true polygon outline is known and triangle 31 can be properly resized. By transforming the vertices a, b and c with respect to the sizing displacement value and the relevant portion of the true outline, into vertices a', b' and c' in illustration 9F, the proper shape is constructed with only partial information about the complete and final shape as shown in 9G.

After sizing, each triangle can be rendered individually into pixels, and this is the point where the combined image is formed as illustrated in 9G and 9H.

An enabler for this sizing algorithm is knowing the part of the original polygonal outline relevant to each individual triangle. The same outlining method can be used in other ways in computational lithography, such as in distortion, where the image is intentionally distorted to counteract the inherent distortion from the projecting system. One such distortion is optical aberration.

In classical image distortion compensation methods, every point in an image is distorted (displaced) by a certain amount corresponding to the inverse of the distortion at the particular point. The classical distortion compensation method is wasteful for binary images such as lithographical images, because only the outlines in the image change between exposed and unexposed due to compensation processing. The fully exposed and the fully unexposed areas will be unaffected, but, classically, all fractured elements are processed, even when they are unaffected.

By having knowledge of the outlines in the final image while processing fractured elements, one can apply the distortion only where it matters, on the true outline, and thereby save valuable computational efforts. The triangles with encoded information of true and false outlines make it also possible to process distortions in parallel, applying them immediately to each fractured triangle, without the need for the complete image. The application of the distortion (or distortion compensation) is very similar to the sizing example earlier—by vertex transformations. In the case with distortion compensation, the vertices on the outline get displaced by an offset corresponding to the inverse of the distortion at a particular coordinate.

Leveraging Triangle Properties for Corner Operations and Proximity Searches

In computational lithography, it is sometimes beneficial to know the presence of corners in close proximity. One such application is for corner enhancement, where energy gets added to or subtracted from corners in order to improve the fidelity of the resulting image on the substrate and suppress corner rounding. If two or more corners are in close proximity, the sum of the energy added to the corners might be too high and unintentionally cause bridging (shorts or leakages between structures) or other similar artifacts. For corners in close proximity, the added energy should be down-weighted or reduced as a function of the corner to corner distance.

One efficient proximity search begins with a sorted or indexed list of vertices that is generated in the same way as described above. The list conveniently is ordered or indexed by true vertices and includes the two edges originating from the vertex. Some vertices will coincide at the exact same location, but (setting aside the practically irrelevant star burst case) a true vertex will have two true edges emanating from the vertex.

The list serves multiple purposes for corner operations. The true corners of the resulting image are explicitly given in the list. The corner enhancement function need only be applied to the true corners. Because it is able to distinguish between true and false corners, the intended image from all triangles need not be reconstructed in order to find the true corners. Here, this information is available as soon as the list is complete. This vector domain data improves on previous approaches to finding corners by applying convolution kernels in the pixel domain.

The orientation and opening angles of the true corners are explicitly given by the list by the true edges paired with the true corners. Since a corner enhancement function often adds energy as a function of opening angle and orientation, this information is very useful.

The proximity down-weighting relies on knowledge of corners in close proximity. This information is given implicitly by the list as the true corners are sorted on location. For any given location, true corners in the proximity can be found by traversing a limited section of the list, looking for vertexes within a radius or window of the given location. The search area can even be directed to the area opposite to the opening angle.

The principles of corner enhancement and proximity down-weighting are illustrated in FIG. 10. Corners in close proximity get the energy added by the corner enhancement function down-weighted to prevent bridging. The sorted list of true corners enables neighboring true corners to be identified.

In FIG. 10, three triangles 41-43 are shown in 10A, constituting two polygons when combined in the final image. The corners a, c and g will get extra energy added to enhance the fidelity of the image on the substrate. The location of the true corners, their opening angles and orientations are given by property information encoded with the triangles. However, triangle 41 and 42 and their corners b and c have no explicit knowledge of triangle 43 and its corners e and f and vice versa. For proper proximity down-weighting, the true corners of other geometries in the proximity range must be found. This is done by traversing the sorted or indexed list of true corners. In 10B, the corner enhancement energy is symbolized by the circles a-g and the amount of energy by the circle radius. As illustrated, corners a, b and g receive full strength of the corner enhancement, while corners b, d, e and f receive less enhancement or even reduced energy doses, as a consequence of the proximity.

Leveraging Triangle Properties to Optimize Image Representation

In raster based lithography systems, the fractured geometries are rendered into pixels. Since high-end semiconductor designs are very large, the pixel representation stresses the memory subsystem and data transport. Using the technology disclosed, the true outline formed by the fractured geometries can be predicted. By leveraging this true outline information, the pixel representation can be greatly optimized.

One approach to rendering gray values of pixels is using sub-pixel grids to represent edges that bisect pixels. Here we introduce the concept of high and low resolution represented by pixels and sub-pixels, where pixels correspond to the grid of the lithographical writing system and sub-pixels to a finer grid in which the rasterizer operates to produce grayscale values. This approach is extensively discussed in U.S. patent application Ser. No. 09/954,721, "Graphics Engine for High Precision Lithography", filed on Sep. 12, 2001, naming inventors Martin Olsson, Stefan Gustavson, Torbjörn Sandström, and Per Elmfors. The pixels are assigned grayscale values corresponding to an energy intensity level in the image projector, while the sub-pixels are binary, i.e. either on or off. The transformation from sub-pixels to pixels uses super sampling, a method sometimes used in the art of computer graphics. In this example, one pixel corresponds to 8×8 sub-pixels, but other grids of sub-pixels can be selected.

One practical issue resulting from the high resolution, sub-pixel representation of the image is memory consumption. When working primarily in the sub-pixel domain, the image cannot be super sampled into pixels until all fractured geometries are rendered. When two or more geometries coincide, the corresponding sub-pixel representation must be merged together. The final values of individual sub-pixels are not known until all geometries for the specific area are complete.

Using a combination of triangulation and encoding corner and edge properties, the completion of sub-pixel areas that are on true edges can be predicted and super sampling performed without retaining the sub-pixel representation in memory. Any true corner can be completed regardless of the triangles that share it. In FIG. 4, the corner h is shared by triangle 11, 12, 14 and 15. When corner h of triangle 11 is rendered, the encoded information with the triangle tells us that one edge is true (a-h) and one is false (h-b). Since all true corners are also in the sorted list of vertices, the corner h can be used to gather information of the missing true edge (g-h). With both true edges, the corner pixel can be rendered and supersampled into low resolution.

The triangle 14 is a similar case where one edge is true (g-h) and the missing true edge is found in the list of vertices.

With the triangles 12 and 15, the cases are slightly different in that all edges that shares the corner h are false. However, the information encoded with the triangles 12 and 15 tells us that the corner h is a true corner and hence that the true edges (h-a) and (g-h) can be found in the list of vertices.

To summarize, all four triangles 11, 12, 14 and 15 have knowledge of that the corner h is a true corner of the polygon and that the lacking edge information can be found in the list of vertices. The same is true for pixels that contain true edges and no corners.

FIG. 11 provides examples of leveraging knowledge of true edges vs. false edges of the resulting image in order to preserve memory and to overlap the super sampling with the rendering processes. Two triangles are to be rendered in a high resolution sub-pixel grid. The triangles are adjacent and are a result of fracturing of a polygon, in this case a trapezoid.

In FIG. 11A, the top corner of triangle 51 is to be rendered. FIG. 11B shows the sub-pixel grid for the top-most section of the triangle. The dashed lines a-b and b-c illustrate the vector representations of the top and left edges of the triangle. Encoded with the triangle is information of true and false edges. Since both edge a-b and b-c are true edges, one can derive the conclusion that this particular 8×8 matrix of sub-pixels is now complete and that no additional objects will fall into the same region. The area can therefore be super sampled into the grayscale value 11C and the costly, memory consuming high resolution sub-pixel representation discarded.

One should recognize that use of a sub-pixel grid and supersampling in the case of FIGS. 11A-C is a convenient way to calculate the area covered by the interior of the polygon with a minimum of multiplication or division operations, which operate relatively slowly in a computer. The related application Ser. No. 09/954,721 describes operations to intersect sub-pixel maps and thereby calculate an area.

The rendering to a sub-pixel grid of the bottom left corner of triangle 51 in 11D is shown in 11E. In this case, the edge a-b is a true edge but edge a-c is false. The presence of a false edge tells us that this particular area of the image is not yet complete and the super sampling can be postponed until the adjacent triangle 2 is rendered. Here, the sub-pixel representation must be preserved. When triangle 52 is rendered, the presence of a high resolution sub-pixel representation along the edge a-b instructs the rendering algorithms to perform a read-modify-write operation in order to merge the two edges together as shown in 11F. When no such sub-pixel representation is already present, the rendering can simply perform a much faster write only operation.

The rendering in FIGS. 11D-F can be simplified to the same case as in FIGS. 11A-C by recognizing that edge a-c in FIG. 11E is a false edge, not a boundary between inside and outside the polygon 51-52. When this property of edge a-c is recognized, the calculation of the area can be based on the true edges and the false edge can effectively be ignored. The false edge can effectively be ignored because the portions of adjoining triangles 51 and 52 that share the false edge a-c are complementary. By complementary, we mean that any sub-pixel or fraction of a sub-pixel along edge a-c that is not part of triangle 51 is necessarily part of triangle 52 (except at the corner, of course.) Ignoring the false edge and calculating the area bounded by the true edges avoids rounding errors that might be introduced when false edge a-c is not aligned with a sub-pixel border. Ignoring the false edge when calculating the area can reduce the number of processing steps required. In effect, the triangles that are separated by a false edge are merged. This works for semiconductor patterns, even though it causes some logical hesitation, because design rules ensure that a pixel contains no more than two true edges.

One might hesitate and argue that objects do not need to be adjacent to coincide in the same pixel and that the encoding of false and true edges would not catch two geometries in close proximity. While the observation is valid for arbitrary patterns, it is not an issue for semiconductor patterns. In semiconductor designs, strict design rules dictate the minimum space between geometries in order to prevent bridging (shortcuts or shorts). As long as this minimum space is larger than the pixel, neighboring geometries will never share the same pixels. In present implementations, the minimum spacing between adjacent features required by design rules is on the order of 2½ pixels.

Computational Lithography Apparatus based on Triangulation

FIG. 12 is a block diagram of an apparatus for computational lithography. The illustration is greatly simplified but shows the basic transforms from the design data to an image that can be projected onto a substrate in a lithographical writing system. Because the design includes functional blocks with a processing flow from left to right, both the device and method are illustrated. This apparatus performs computational lithography based on triangulation. Subsequent rasterization and imaging steps are depicted in U.S. application Ser. No. 09/954,721, but omitted here for the sake of clarity.

The input to the system is a lithographical design encoded in a vector format, typically OASIS or GDSII. The function 61 performs overlap removal so that all polygons are outlined. In the example, three polygons are shown and two of them overlap. The function reformats the data into the polygons shown on the right side of function 61. The processes for overlap removal are well known in the art and are typically performed by a tool called MDP, Mask Data Prep. In practice, patterns are much more complex that shown in this example.

The results from step 61 are stored on a media, here a disk system (62). This is typically the interface between the writing system and the Mask Data Prep.

The Polygon Dispatcher (63) reads polygon data from the disk system and distributes the polygons into parallel processing channels. The parallelism is optional but performance is often an important factor in lithography and the design of the apparatus lends itself to parallel processing. Here, the two polygons are distributed on different channels (63 to 64). For the sake of clarity, only one channel is shown on the output (64 to 65).

The polygons are fractured (64) into triangles and the edge properties of the original polygon encoded with them.

The Triangle Dispatcher (65) distributes the triangles on parallel channels. Again, this is an option. The sorted list of vertices is shared among the channels when the succeeding steps take advantage of knowledge of vertex proximity.

The morphology of the triangles takes place, such as sizing (66).

The triangles are rendered (67) into pixels and transforms are performed, such as corner enhancement. The sorted list or index of vertices can be used to select the correct energy compensation as a function of proximity to corners of the current polygonal shape to which the compensated vertex belong and to corners of neighboring polygons.

The output from rendering is stored in a distributed shared memory (68), so that the proper assembly of the triangles into the final image can take place. The pixel representation may have a pixel or sub-pixel resolution depending on whether a particular pixel is considered complete or if merging with additional objects will take place.

Some Particular Embodiments

The technology disclosed may be practiced as a method or a system adapted to practice the method. The technology disclosed may be embodied in an article of manufacture such as media impressed with logic to carry out computer assisted decomposition of micro-lithographic or other polygon pattern data.

One embodiment is a method of decomposing micro-lithographic pattern data and using it to produce a latent image in a radiation sensitive layer on a workpiece. A micro-lithographic pattern can be used for defining features of an electronic device on a semiconductor substrate. It also can be used to define features of an electronic device on other kinds of substrate, such as flexible plastic. A micro-lithographic pattern also can be used to define parts of a nanomachine. For instance, it may be used to define struts, suspensions and torsion members of nanotechnology. A latent image may be either a positive or negative image. That is, it may define an area that is to be protected from further operations or to be subject to further operations. One radiation sensitive layer that is used is resist. Workpieces may be photomasks, sometimes referred to as reticles, that are used to produce devices. Workpieces may also be the device substrates, to which micro-lithographic tooling writes directly.

This method includes electronically receiving at least part of a micro-lithographic pattern. It includes triangulating a polygon found in the pattern data that has four or more edges. As described above, triangulating a polygon involves constructing non-intersecting connections between vertices of a polygon, which become edges of the resulting triangles. We refer to triangulating a polygon that has four or more edges because a polygon that has three edges is already a triangle. It is the nature of triangulation that the plurality of triangles produced from a polygon have edges that are not constrained to be oriented parallel to an axis. This is different from the operation of typical micro-lithographic patterning equipment, because most equipment has a strong bias or even a requirement for the geometry being processed to have one or two sides aligned to an x-axis or y-axis. The method further includes feeding the triangles via the data path to an image producing subsystem the drives an image projector. The image producing subsystem and image projector use the triangles to define an image produced by the image projector, to drive the image projector and to expose a latent image in the radiation sensitive layer on the workplace. This method, as described, results in a latent image in the radiation sensitive layer on the workpiece that can be developed and used to form a feature of an electronic device.

The image projector may use various forms of radiant energy. Photon energy in wavelengths as short as extreme ultraviolet or x-ray may be used. Electron beams may also be used. Depending on the radiation, a variety of energy modulation schemes are possible. The Sigma7500 produced by the assignee of this disclosure uses an array of micro-mirrors to control photon energy. Photon energy may also be modulated using shutters, such as an LCD array. Other mechanisms are applied to electron beams. The particular type of image projector used is limited only by its ability to be driven by an image producing subsystem that accepts arbitrarily oriented triangles as input.

One aspect of this first embodiment is a refinement to the method wherein edges of the triangles produced by triangulation are encoded by whether they represent a boundary between an inside and an outside of the polygon. Original edges of the polygon represent a boundary between the inside and outside of the polygon. Edges that are constructed as connections between vertices of the polygon that are not on the same edge are not boundaries between the inside and outside of the polygon, because they merely divide the interior space of the polygon into adjoining triangles. This classification produces edge encodings, which are fed with the triangles to the image producing subsystem. The data path along which the edge encodings and triangles are fed to the image producing subsystem may involve one, two or more channels. A single channel could interleave edge encodings and triangles or group the data into blocks. Two or more channels could feed the edge encodings and triangles more or less in parallel to the image producing subsystem.

One edge encoding embodiment uses a permutation of vertices of the triangles and a datum indicating how many edges represent a boundary between the inside and the outside of the polygon. A useful permutation of vertices begins with a vertex that is at one end of a trace of one or two consecutive boundary edges. This encoding is efficient, requiring only two bits in addition to the permutation of triangle vertices, but many alternative encodings are possible.

Another aspect of this embodiment involves encoding vertices of the triangles, in addition to the edges. The vertices are encoded by whether they represent an intersection of two segments of the boundary between the inside and the outside of the polygon. This vertex encoding represents true vertices of the polygon that is triangulated. According to this aspect, the vertex encodings are fed to the image producing subsystem with the triangles and edge encodings. This aspect can be used with the permutation and two bit edge encoding described above, or any other encoding. The vertex encoding may include an additional datum that is conditional on the edge encoding and that indicates how many and which of the vertices represent the intersection of two segments of the boundary between the inside and outside of the polygon. Other encodings may be used to represent the true vertices.

This method can be extended by further fracturing at least some of the triangles produced by triangulation. This extension includes filtering the triangles produced by triangulation to select particular triangles. Then, further dividing the particular triangles to produce contained triangles. A particular contained triangle uses at least one vertex of the triangle that contains it. It introduces at least one vertex that was not a vertex of the triangle that contains it. The contained triangles supplant the particular triangles. That is, the contained triangles are the ones fed to the image producing subsystem. Optionally, this extension may include encoding edges of the contained triangles by whether they coincide with the edges of the containing triangles. Where the edges coincide, the encoding of the containing triangles edges can be adopted. Where the edges are internal edges created by further dividing the particular triangles, the created internal edges are encoded accordingly. These edge encodings supplant the edge encodings of the triangles that are further divided. This extension can be applied when edges are encoded with triangulation or when both edges and vertices are encoded.

The workpiece of this method may be a wafer that is directly written. Optionally, the latent image in the radiation sensitive layer on the workpiece may be developed and the workpiece further processed to form a feature of a semiconductor device. Alternatively, the workpiece may be a photomask. The method may further include developing the latent image and then using the workpiece in a stepper or scanner to form a latent image on an additional radiation sensitive layer on a substrate. The latent image on the substrate is developed and further processed to form a feature of a semiconductor device. Whether the workpiece is a wafer or a photomask, the method may be applied when edges are encoded with triangulation or when both edges and vertices are encoded.

The method described may also be embodied in a system for decomposing micro-lithographic pattern data and creating a latent image in a radiation sensitive layer on a workpiece. This system includes a micro-lithographic pattern triangulating subsystem and a data path coupled to the triangulating subsystem. It includes an image producing subsystem coupled to the data path and an image projector coupled to the image producing subsystem. The triangulating subsystem includes logic coupled to memory. The logic may be implemented in software, such as program logic operable on one or more processors, in firmware, such as one or more FPGAs, or custom hardware, such as a custom ASIC, custom RISC processor, custom cell architecture or other specially designed circuit. The logic is adapted to triangulate a polygon having four or more edges from the micro-lithographic pattern, thereby producing a plurality of triangles that have edges that are not constrained to orientation parallel to an axis, which are output on the data path. The image producing subsystem is adapted to process triangles that have edges that are not constrained to orientation parallel to an axis. The image producing subsystem may, of course, have its own logic and memory to process triangles. Any of the features of the method described above can be incorporated into additional logic operative and memory.

Among the features of the method that are readily adapted into the system are edge encoding and vertex encoding. The system described may further include second logic and memory that is adapted to encode edges of the plurality of triangles by whether they represent a boundary between the inside and the outside of the polygon that is triangulated. These edge encodings are output with the plurality of triangles on the data path. Optionally, third logic may be added to the second logic, the third logic adapted to encode vertices of the triangles by whether they represent an intersection of two segments of the boundary between the inside and outside of the polygon. These vertex encodings are output with the edge encodings and plurality of triangles on the data path.

Another embodiment applies more generally to decomposing polygons while preserving at least some information regarding the edges of polygons that represent a boundary between the inside and outside of the polygon. This method includes electronically receiving pattern data including the polygons. The polygons are triangulated, thereby producing a plurality of triangles that have edges that are not constrained to an orientation parallel to an axis. The method further includes encoding the edges of the triangles by whether they represent a boundary between inside and outside of the polygon, thereby producing edge encodings. The edge encodings with the triangles are electronically fed to a further processing device. The further processing device may be software combined with logic that is distinct from or shared with the logic used for triangulation.

The further processing device may relocate edges of the triangles that correspond to boundaries of the polygon. Relocation of the edges, for example, may correspond to shrinking or growing a geometry. Or, it may correspond to distorting a geometry, for instance, to correct imperfections in lenses and other system component. The device may use the vertex encodings to identify corners of the polygon and enhance printing of the identified corners. For corners with acute openings (e.g., steeples), enhancement often involves increasing the exposure dose. For corners with obtuse openings (e.g., rectangle intersections in FIG. 9A), enhancement may involve decreasing the exposure dose at the vertex. The relocation of edges proceeds with partial reconstruction of polygons from triangles, without any need to reconstruct whole polygons. It is enough to know the position, relative to a particular edge, of the edges to the right and left. For example, in FIG. 9E, relocation of edge b-c uses information about the location of edges a-b and c-e, which are encoded as true edges.

Optionally, triangles can be processed in parallel to relocate edges. Use of the edge encodings facilitates parallel processing.

The further processing device may be adapted to enhance corner dosages based on proximity of a corner or vertex to edges and/or vertexes of polygons. The proximity of the encoded vertex to edges of the same polygon may correspond to the opening angle at the vertex. The proximity of the encoded vertex to other vertices can be found by searching the vertex list. The proximity of the encoded vertex to an edge of another polygon may require searching for vertices in a range limited by the maximum size of a fractured part of the same polygon, which is computationally more expensive than searching only for neighboring vertices.

The further processing device may alternatively or additionally use edge and vertex encodings to identify false edges and simplify calculating a gray value for a pixel that contains a false edge. If the pixel contains a false edge and no true edge or vertex, then it is unnecessary to render a sub-pixel map. The false edge can be treated as shared between adjoining triangles. A shared edge is one without a gap or overlap between the adjoining triangles. Rounding error artifacts can be avoided by not trying to merge sub-pixel maps along the false edge. A shared edge that terminates in a true vertex within the pixel can be ignored when the true edges connected to the true vertex are identified. A gray value for the pixel can be calculated from the true edges without requiring consideration of the false edge, because there is no gap or overlap between the triangles that share the false edge.

Calculation of area inside a polygon, within a pixel, can optionally be calculated using only true edges, without requiring a sub-pixel map or supersampling.

The aspects of this method embodiment that passes data to a further processing device are similar to the aspects of the prior embodiments. For instance, one aspect involves edge encodings that include a permutation of vertices of the triangles and a datum indicating how many edges represent a boundary between the inside and the outside of the polygon. The data may consist of two bits, thereby encoding whether zero, one, two or three edges of the triangle represent a boundary between the inside and outside of the polygon.

This embodiment may be extended to encoding vertices of the triangles by whether they represent an intersection of two segments of the boundary between the inside and outside of the polygon, thereby producing vertex encodings. The vertex encodings are fed with the triangles and edge encodings to a further processing device. Optionally, the vertex encodings may include an additional datum that is conditional on the edge encoding and indicates how many of and which of the vertices represent the intersection of two segments of the boundary between the inside and the outside of the polygon.

This method can be extended by further fracturing at least some of the triangles produced by triangulation. This extension includes filtering the triangles produced by triangulation to select particular triangles and further dividing them to produce contained triangles. A particular contained triangle uses at least one vertex of the triangle that contains it. This method introduces at least one vertex that was not a vertex of the triangle that contains it. The contained triangles supplant the particular triangles. That is, the contained triangles are the ones fed to the image producing subsystem. Optionally, this extension may include encoding edges of the contained triangles by whether they coincide with the edges of the containing triangles. Where the edges coincide, the encoding of the containing triangles edges can be adopted. Where the edges are internal edges created by further dividing the particular triangles, the created internal edges are encoded accordingly. These edge encodings supplant the edge encodings of the triangles that are further divided. This extension can be applied when edges are encoded or when both edges and vertices are encoded.

The general embodiment for decomposing polygons while preserving at least some information regarding the edges and/or vertices of the original polygons can be practiced as a system. The system includes a polygon triangulating subsystem and a data path coupled to the triangulating subsystem. The triangulating subsystem includes logic and memory. The logic is adapted to a triangulated polygon having four or more edges from the micro-lithographic pattern, thereby producing a plurality of triangles that have edges that are not constrained to orientation parallel to an axis, and to encode edges of the plurality of triangles by whether they represent a boundary between the inside and the outside of the polygon that is triangulated. The triangles and edge encodings are output on the data path. The image rendering subsystem is adapted to process triangles that have edges that are not constrained to orientation parallel to an axis. The image producing subsystem may, of course, have its own logic and memory to process triangles. Any of the features of the method described above can be incorporated into additional logic.

Among the features of the method that are readily adapted into the system is vertex encoding. The system described may further include second logic and memory that is adapted to encode vertices of the triangles by whether they represent an intersection of two segments of the boundary between the inside and outside of the polygon. These vertex encodings are output with the edge encodings and plurality of triangles on the data path.

While the present invention is disclosed by reference to the preferred embodiments and examples detailed above, it is understood that these examples are intended in an illustrative rather than in a limiting sense. Computer-assisted processing is implicated in the described embodiments. Accordingly, the present invention may be embodied in methods for triangulating and encoding polygons, systems including logic and resources to carry out triangulation and encoding of polygons, systems that take advantage of computer-assisted triangulation and encoding of polygons, computer-readable media impressed with logic to carry out triangulation and encoding of polygons, data streams impressed with logic to carry out triangulation and encoding of polygons, or computer-accessible services that carry out computer-assisted triangulation and encoding of polygons. It is contemplated that modifications and combinations will readily occur to those skilled in the art, which modifications and combinations will be within the spirit of the invention and the scope of the following claims.

We claim as follows:

1. A method of decomposing microlithographic pattern data and using it to produce a latent image in a radiation sensitive layer on a workpiece, the method including:
   electronically receiving at least part of a microlithographic pattern;
   triangulating a polygon having four or more edges from the microlithographic pattern, thereby producing a plurality of triangles that have edges that are not constrained to orientation of the edges to be parallel to any axis;
   feeding the triangles via a datapath to an image producing subsystem that drives an image projector;
   using the triangles to define an image projected by the image projector, to drive the image projector and to expose a latent image in a radiation sensitive layer on a workpiece.

2. The method of claim 1, further including:
   encoding the edges of the triangles by whether they represent a boundary between an inside and an outside the polygon, thereby producing edge encodings; and
   feeding the edge encodings with the triangles to the image producing subsystem.

3. The method of claim 2, wherein the edge encodings include a permutation of vertices of the triangles and a datum indicating how many edges represent a boundary between the inside and the outside of the polygon.

4. The method of claim 3, wherein the datum consists of two bits, thereby encoding whether zero, one, two or three of the edges of the triangle represent a boundary between the inside and outside of the polygon.

5. The method of claim 3, further including:
   encoding vertices of the triangles by whether they represent an intersection of two segments of the boundary between the inside and the outside of the polygon, thereby producing vertex encodings;

wherein the vertex encodings include an additional datum that is conditional on the edge encoding and that indicates how many of and which of the vertices represent the intersection of two segments of the boundary between the inside and the outside of the polygon; and feeding the vertex encodings with the triangles and the edge encodings to the image producing subsystem.

6. The method of claim 3, further including:

filtering the triangles to select particular triangles;

sub-dividing the particular triangles to produce contained triangles, wherein a particular contained triangle uses at least one vertex of the triangle that contains it and introduces at least one vertex that was not a vertex of the triangle that contains it, thereby supplanting the triangle that contains it; and encoding edges of the contained triangles by whether they coincide with the edges of the containing triangles that are edge encoded as representing a boundary between the inside and the outside the polygon.

7. The method of claim 2, further including:

encoding vertices of the triangles by whether they represent an intersection of two segments of the boundary between the inside and the outside of the polygon, thereby producing vertex encodings; and feeding the vertex encodings with the triangles and the edge encodings to the image producing subsystem.

8. The method of claim 7, further including:

filtering the triangles to select particular triangles;

further triangulating the particular triangles to produce contained triangles, wherein a particular contained triangle uses at least one vertex of the triangle that contains it, thereby supplanting the triangle that contains it;

encoding edges of the contained triangles by whether they coincide with the edges of the containing triangles that are edge encoded as representing a boundary between the inside and the outside the polygon; and encoding vertices of the contained triangles by whether they coincide with the vertices of the containing triangles that are vertex encoded as representing the intersection of two segments of the boundary between the inside and the outside of the polygon.

9. The method of claim 7, wherein the workpiece is a wafer that is being directly written, further including developing the latent image on the workpiece and further processing the workpiece to form a feature of a semiconductor device.

10. The method of claim 7, wherein the workpiece is a photomask, further including:

developing the latent image on the workpiece;

using the workpiece in a stepper or scanner to form a latent image on an additional radiation sensitive layer on a substrate;

developing the latent image on the substrate; and further processing the substrate to form a feature of a semiconductor device.

11. The method of claim 2, wherein the workpiece is a wafer that is being directly written, further including developing the latent image on the workpiece and further processing the workpiece to form a feature of a semiconductor device.

12. The method of claim 2, wherein the workpiece is a photomask, further including:

developing the latent image on the workpiece;

using the workpiece in a stepper or scanner to form a latent image on an additional radiation sensitive layer on a substrate;

developing the latent image on the substrate; and further processing the substrate to form a feature of a semiconductor device.

13. The method of claim 1, further including triangulating the polygon without creating new vertices.

14. The method of claim 13, further including triangulating the triangles and producing new vertices.

15. The method of claim 1, further including triangulating the polygon using existing vertices and non-crossing diagonals.

16. The method of claim 1, further including restricting the triangles produced by the triangulating to have unambiguous edges that are either internal or external edges, but not both.

17. The method of claim 1, further including transforming vertices of the triangles before using the triangles to define the image projected by the image projector.

18. The method of claim 17, wherein transforming the vertices accomplishes one or more of sizing, morphology, or corner enhancement that changes the image projected.

19. A system for decomposing microlithographic pattern data and creating a latent image in a radiation sensitive layer on a workpiece, the system including:

a microlithographic pattern triangulating subsystem;

a datapath coupled to the triangulating subsystem;

an image producing subsystem, coupled to the datapath;

an image projector, coupled to the image producing subsystem;

wherein the triangulating subsystem includes hardware coupled to memory, the hardware adapted to triangulate a polygon having four or more edges from the microlithographic pattern, thereby producing a plurality of triangles that have edges that are not constrained to orientation of the edges to be parallel to any axis, and output the plurality of triangles on the datapath; and wherein the image producing subsystem is adapted to process triangles that have edges that are not constrained to orientation parallel to an axis.

20. The system of claim 19, wherein the triangulating subsystem further includes:

second hardware coupled to memory, the second hardware adapted to encode the edges of the plurality of triangles by whether they represent a boundary between an inside and an outside the polygon, thereby producing edge encodings, and output the edge encodings with the plurality of triangles on the datapath.

21. The system of claim 20, wherein the triangulating subsystem further includes:

third hardware coupled to memory, the third hardware adapted to encode vertices of the triangles by whether they represent an intersection of two segments of the boundary between the inside and the outside of the polygon, thereby producing vertex encodings, and output the vertex encodings with the plurality of triangles on the datapath.

22. A method of decomposing polygons while preserving at least some information regarding edges of the polygons that represent a boundary between an inside and an outside of the polygon, the method including:

electronically receiving pattern data including the polygons;

triangulating a polygon from the pattern data, thereby producing a plurality of triangles that have edges that are not constrained to orientation of the edges to be parallel to any axis;

encoding the edges of the triangles by whether they represent a boundary between an inside and an outside the polygon, thereby producing edge encodings; and feeding the edge encodings with the triangles electronically to a further processing device.

23. The method of claim 22, wherein actions of the further processing device further include using the edge encodings to relocate the boundaries between the inside and the outside of the polygon, based upon partial reconstruction of the polygon from the triangles.

24. The method of claim 23, wherein actions of the further processing device further include processing individual triangles of the polygon in parallel to relocate the boundaries of the polygon.

25. The method of claim 23, further including encoding vertices that are part of the boundary of the polygon, wherein actions of the further processing device further include:
    processing the encoded vertices to determine proximity to other vertices that are part of a boundary of any polygon; and
    adjusting doses at the encoded vertices responsive to the proximity.

26. The method of claim 23, wherein actions of the further processing device further include:
    processing encoded vertices that are part of the boundary of the polygon to determine proximity to other polygons; and
    adjusting doses at the encoded vertices responsive to the proximity.

27. The method of claim 23, wherein the datum consists of two bits, thereby encoding whether zero, one, two or three of the edges of the triangle represent a boundary between the inside and outside of the polygon.

28. The method of claim 23, further including:
    encoding vertices of the triangles by whether they represent an intersection of two segments of the boundary between the inside and the outside of the polygon, thereby producing vertex encodings;
    wherein the vertex encodings include an additional datum that is conditional on the edge encoding and that indicates how many of and which of the vertices represent the intersection of two segments of the boundary between the inside and the outside of the polygon; and
    feeding the vertex encodings with the triangles and the edge encodings the further processing device.

29. The method of claim 23, further including:
    filtering the triangles to select particular triangles;
    further dividing the particular triangles to produce contained triangles, wherein a particular contained triangle uses at least one vertex of the triangle that contains it and introduces at least one vertex that was not a vertex of the triangle that contains it, thereby supplanting the triangle that contains it; and
    encoding edges of the contained triangles by whether they coincide with the edges of the containing triangles that are edge encoded as representing a boundary between the inside and the outside the polygon.

30. The method of claim 22, wherein actions of the further processing device further include:
    using the vertex encodings to identify corners of the polygon; and
    enhancing printing of the identified corners.

31. The method of claim 22, wherein edge encodings include a permutation of vertices of the triangles and a datum indicating how many edges represent a boundary between the inside and the outside of the polygon.

32. The method of claim 22, further including:
    encoding vertices of the triangles by whether they represent an intersection of two segments of the boundary between the inside and the outside of the polygon, thereby producing vertex encodings; and
    feeding the vertex encodings with the triangles and the edge encodings to the further processing device.

33. The method of claim 32, further including:
    filtering the triangles to select particular triangles;
    further triangulating the particular triangles to produce contained triangles, wherein a particular contained triangle uses at least one vertex of the triangle that contains it, thereby supplanting the particular triangles;
    encoding edges of the contained triangles by whether they coincide with the edges of the containing triangles that are edge encoded as representing a boundary between the inside and the outside the polygon, thereby supplanting the edge encodings of the further triangulated particular triangles; and
    encoding vertices of the contained triangles by whether they coincide with the vertices of the containing triangles that are vertex encoded as representing the intersection of two segments of the boundary between the inside and the outside of the polygon.

34. A system for fracturing polygons and encoding at least some information regarding edges of the polygons that represent a boundary between an inside and an outside of the polygon, the system including:
    a polygon triangulating subsystem;
    a datapath coupled to the triangulating subsystem; and
    an image rendering subsystem, coupled to the datapath;
    wherein the triangulating subsystem includes hardware coupled to memory, the hardware adapted to
        triangulate a polygon having four or more edges from the microlithographic pattern, thereby producing a plurality of triangles that have edges that are not constrained to orientation of the edges to be parallel to any axis, and output the plurality of triangles on the datapath, and
        encode the edges of the triangles by whether they represent a boundary between an inside and an outside the polygon, thereby producing edge encodings, and output the edge encodings with the plurality of triangles on the datapath; and
    wherein the image rendering subsystem is adapted to process triangles that have edges that are not constrained to orientation parallel to an axis.

35. The system of claim 34, for encoding at least some information regarding corners of polygons between segments that represent the boundary between the inside and the outside of the polygon, wherein the triangulating subsystem further includes:
    second hardware coupled to memory, the second hardware adapted to encode vertices of the triangles by whether they represent an intersection of two segments of the boundary between the inside and the outside of the polygon, thereby producing vertex encodings, and output the vertex encodings with the plurality of triangles on the datapath.

* * * * *